(12) United States Patent
Komyo et al.

(10) Patent No.: US 8,253,436 B2
(45) Date of Patent: Aug. 28, 2012

(54) SEMICONDUCTOR INTEGRATED CIRCUIT WITH DATA TRANSMITTING AND RECEIVING CIRCUITS

(75) Inventors: Masayasu Komyo, Kanagawa (JP); Yoichi Iizuka, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 12/876,760

(22) Filed: Sep. 7, 2010

(65) Prior Publication Data

US 2011/0057721 A1 Mar. 10, 2011

(30) Foreign Application Priority Data

Sep. 8, 2009 (JP) ................... 2009-206880

(51) Int. Cl.
*H03K 17/16* (2006.01)
*H03K 19/003* (2006.01)
*G06F 13/42* (2006.01)

(52) U.S. Cl. .......................... 326/21; 710/106
(58) Field of Classification Search .................. 326/21, 326/26, 27, 30, 56, 57, 86, 87; 327/108, 327/109, 112, 140, 170, 172–176; 365/189.05, 365/189.11
See application file for complete search history.

(56) References Cited

U.S. PATENT DOCUMENTS

| | | | |
|---|---|---|---|
| 5,467,455 A * | 11/1995 | Gay et al. ....................... | 710/100 |
| 6,356,106 B1 | 3/2002 | Greeff et al. | |
| 6,380,758 B1 | 4/2002 | Hsu et al. | |
| 6,489,808 B2 * | 12/2002 | Iizuka ............................. | 326/56 |
| 6,904,552 B2 * | 6/2005 | Cowles ......................... | 714/719 |
| 7,808,269 B2 | 10/2010 | Matsudera | |
| 7,999,572 B2 * | 8/2011 | Komyo et al. .................. | 326/58 |
| 2003/0039151 A1 | 2/2003 | Matsui | |
| 2003/0080774 A1 * | 5/2003 | Funaba .......................... | 326/30 |
| 2004/0250165 A1 * | 12/2004 | Tanizaki ....................... | 714/30 |
| 2006/0050597 A1 | 3/2006 | Janzen | |
| 2011/0057720 A1 * | 3/2011 | Komyo et al. ................. | 327/551 |

OTHER PUBLICATIONS

JEDEC Standard, DDR2 SDRAM Specification, JESD79-2E (Revision of JESD79-2D), JEDEC Solid State Technology Association, Apr. 2008, 125 pages.
U.S. Appl. No. 12/876,747, filed Sep. 7, 2010, Komyo et al.
U.S. Appl. No. 12/876,973, filed Sep. 7, 2010, Komyo et al.
Masayasu Komyo et al., USPTO Office Action, U.S. Appl. No. 12/876,747, Feb. 2, 2011, 10 pages.
Masayasu Komyo et al. USPTO Notice of Allowance, U.S. Appl. No. 12/876,793, Apr. 14, 2011, 10 pages.
Masayasu Komyo et al. USPTO Office Action, U.S. Appl. No. 12/876,747, Jul. 19, 2011, 9 pages.
Masayasu Komyo et al. USPTO Notice of Allowance, U.S. Appl. No. 12/876,747, Sep. 30, 2011, 7 pages.

* cited by examiner

*Primary Examiner* — Shawki S Ismail
*Assistant Examiner* — Dylan White
(74) *Attorney, Agent, or Firm* — Foley & Lardner LLP

(57) ABSTRACT

Provided is a semiconductor integrated circuit according to an exemplary aspect of the present invention including a data transmitting circuit and a data receiving circuit that receives data transmitted from the data transmitting circuit. The data transmitting circuit includes a data output circuit that outputs the data or sets an output to a high impedance state, and a control circuit that outputs a control signal to the data output circuit so that the data output circuit outputs the data when the data transmitting circuit transmits the data, and the data output circuit keeps outputting data last output in the previous data transmission, during a predetermined period after the previous data transmission when the data transmitting circuit further transmits another data after transmitting the data.

5 Claims, 3 Drawing Sheets

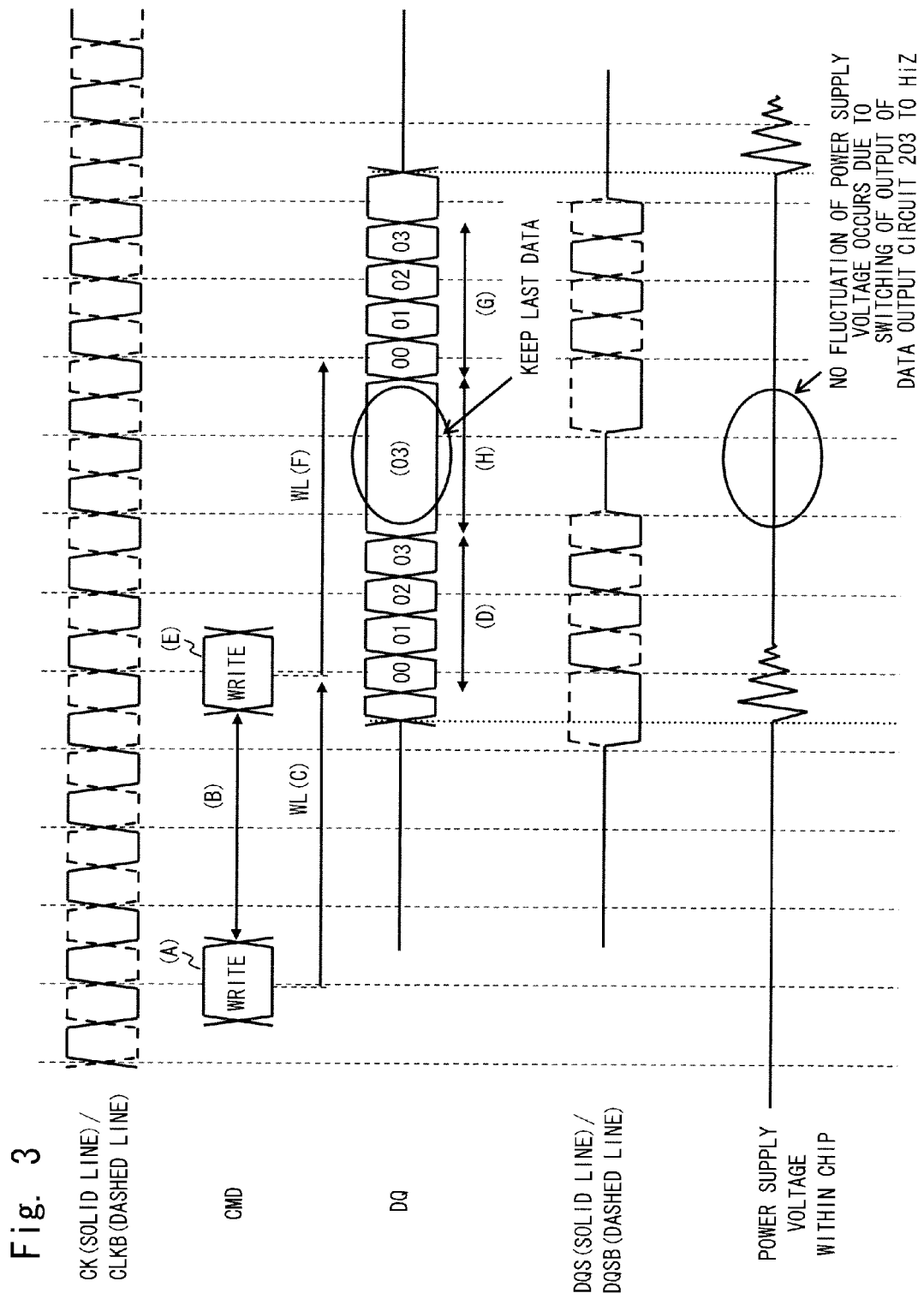

SEMICONDUCTOR INTEGRATED CIRCUIT WITH DATA TRANSMITTING AND RECEIVING CIRCUITS

INCORPORATION BY REFERENCE

This application is based upon and claims the benefit of priority from Japanese patent application No. 2009-206880, filed on Sep. 8, 2009, the disclosure of which is incorporated herein in its entirety by reference.

BACKGROUND

1. Field of the Invention

The present invention relates to a semiconductor integrated circuit, and more particularly, to a semiconductor integrated circuit suitable for power-supply noise reduction.

2. Description of Related Art

In a semiconductor integrated circuit, there has been a problem that data transmission between a data transmitting circuit and a data receiving circuit is not accurately executed when power-supply noise occurs on signal lines used for the data transmission between these circuits.

Therefore, a countermeasure, for example, ODT (On Die Termination) technique has been provided to reduce the power-supply noise on signal lines used for data reception of the data receiving circuit (JEDEC STANDARD, DDR2 SDRAM SPECIFICATION JESD79-2E (Revision of JESD79-2D), April 2008, JEDEC SOLID STATE TECHNOLOGY ASSOCIATION).

SUMMARY

In the related art, the countermeasure such as an ODT function has been provided to reduce the power-supply noise which influences the data receiving circuit. However, the related art provides no countermeasure to reduce the power-supply noise which influences the data transmitting circuit. Normally, the data transmitting circuit includes a data output circuit such as a three-state buffer for transmitting data. The data transmitting circuit controls whether the data output circuit outputs the data or not based on a control signal. In other words, the data transmitting circuit controls the data output circuit to output the data or to switch the output of the data output circuit to a high impedance state (HiZ).

However, in the related art, the power-supply noise occurs when the data transmitting circuit controls the output of the data output circuit to be set to HiZ, because the supply of power supply voltage to the signal lines to which the power supply voltage has continuously been supplied is suddenly interrupted. When the data transmitting circuit switches the output of the data output circuit from HiZ to a data transmission state so as to output another data before the power-supply noise converges, another data is influenced by the power-supply noise. The present inventors have found a problem in the related art that, as described above, it is impossible for the data transmitting circuit to transmit the data accurately.

An exemplary aspect of the present invention is a semiconductor integrated circuit including:

a data transmitting circuit; and a data receiving circuit that receives data transmitted from the data transmitting circuit, in which the data transmitting circuit includes:

a data output circuit that outputs the data or sets an output to a high impedance state; and a control circuit that outputs a control signal to the data output circuit so that the data output circuit outputs the data when the data transmitting circuit transmits the data, and the data output circuit keeps outputting data last output in the previous data transmission, during a predetermined period after the previous data transmission when the data transmitting circuit further transmits another data after transmitting the data.

With the circuit structure as described above, it is possible to transmit data accurately by reducing the power-supply noise.

According to an exemplary aspect of the present invention, it is possible to provide a semiconductor integrated circuit capable of transmitting data accurately.

BRIEF DESCRIPTION OF THE DRAWINGS

The above and other exemplary aspects, advantages and features will be more apparent from the following description of certain exemplary embodiments taken in conjunction with the accompanying drawings, in which:

FIG. 3 is a timing chart depicting an operation of the semiconductor integrated circuit according to the first exemplary embodiment of the present invention.

DETAILED DESCRIPTION OF THE EXEMPLARY EMBODIMENTS

Figure 1:
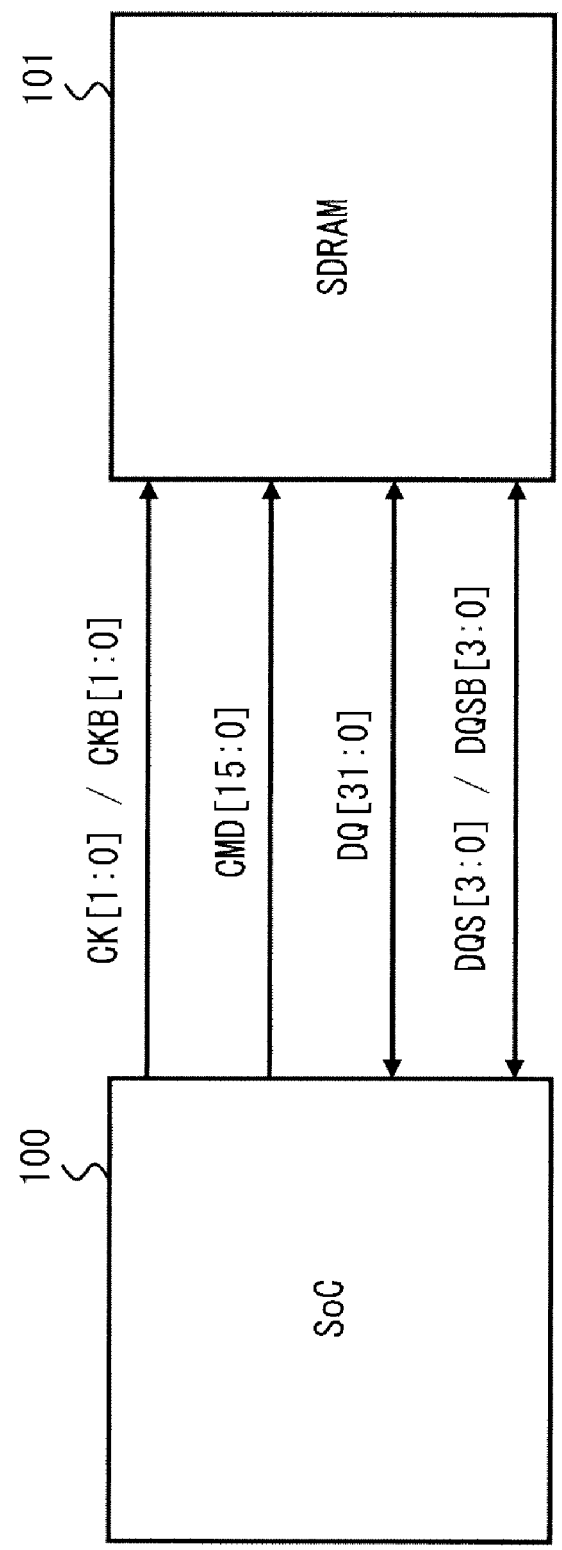
FIG. 1 illustrates a semiconductor integrated circuit according to a first exemplary embodiment of the present invention.

Specific exemplary embodiments of the present invention are described in detail below with reference to the drawings. The same components are denoted by the same reference numerals in the drawings, and for clarity of explanation, repeated explanation is omitted as appropriate.

[First Exemplary Embodiment]

Referring to the drawings, a semiconductor integrated circuit according to a first exemplary embodiment of the present invention will be described. The present invention can be applied to a circuit which includes a data transmitting circuit and a data receiving circuit that receives data transmitted from the data transmitting circuit, and which controls the output of the data transmitting circuit based on a control signal. In this exemplary embodiment, a case is explained hereinafter in which the circuit shown in FIG. 1 includes an SoC (System on Chip) circuit and an SDRAM (Synchronous Dynamic Random Access Memory) circuit, and data transmission is executed between the SoC circuit and the SDRAM circuit through a signal line for bidirectionally transmitting data between these circuits (hereinafter, referred to simply as "bidirectional signal line").

FIG. 1 illustrates a semiconductor integrated circuit according to the first exemplary embodiment of the present invention. The circuit shown in FIG. 1 includes an SoC circuit (data transmitting circuit) 100 and an SDRAM circuit (data receiving circuit) 101. Data transmission is executed between the SoC circuit 100 and the SDRAM circuit 101 in the DDR (double data rate) mode.

First, the circuit structure of the semiconductor integrated circuit according to the first exemplary embodiment of the present invention will be described. The SoC circuit 100 outputs a 2-bit clock signal CK and a 2-bit clock signal CKB, which is a differential signal of the clock signal CK, to the SDRAM circuit 101. The SoC circuit 100 further outputs a 16-bit control signal CMD, which includes commands for each address of the SDRAM circuit 101, to the SDRAM circuit 101. Note that the SDRAM circuit 101 receives the control signal CMD in synchronization with the clock signals CK and CKB.

Each of 32-bit data DQ, a 4-bit strobe signal DQS, and a 4-bit strobe signal DQSB, which is a differential signal of the strobe signal DQS, is bidirectionally transmitted and received between the SoC circuit 100 and the SDRAM circuit 101. A receiving circuit, which is one of the SoC circuit 100 and the SDRAM circuit 101, receives the data DQ in synchronization with the strobe signals DQS and DQSB. Note that the signal names described above also represent the corresponding signal line names.

Figure 2:
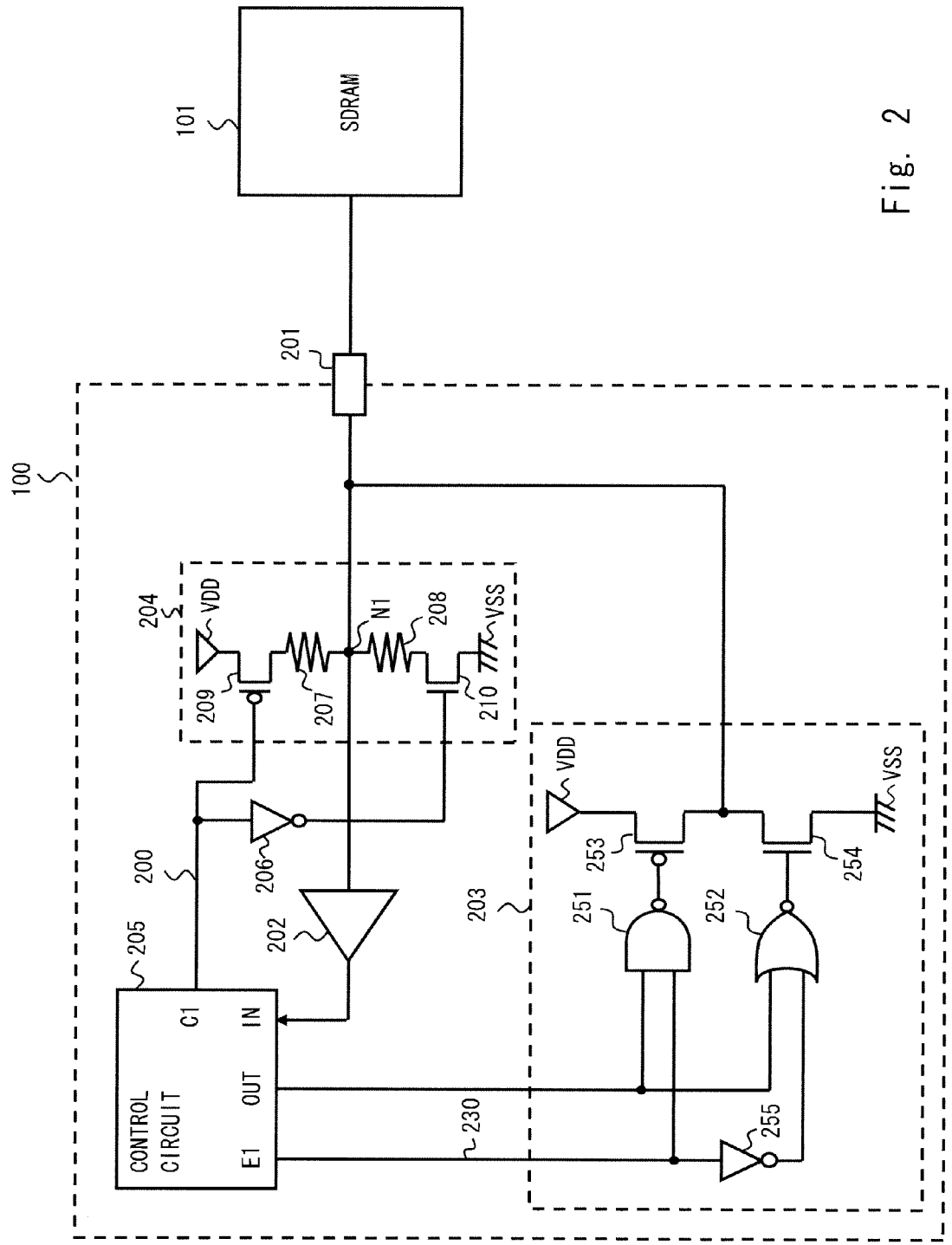
FIG. 2 illustrates the semiconductor integrated circuit according to the first exemplary embodiment of the present invention.

The circuit shown in FIG. 2 shows a 1-bit bidirectional signal line, which is one of strobe signal lines DQS[3:0] and DQSB[3:0] and a data signal line DQ[31:0], and corresponding peripheral circuits of the circuit shown in FIG. 1. In this exemplary embodiment, a case is explained hereinafter in which the 1-bit bidirectional signal line is the data signal line DQ[0]. The data signal line DQ[0] is connected between the SoC circuit 100 and the SDRAM 101 as described above.

The SoC circuit 100 includes an external terminal 201, a buffer 202, a data output circuit 203 which outputs data, a termination circuit 204 which has an ODT function, a control circuit 205 which outputs control signals to each of the data output circuit 203 and the termination circuit 204, and an inverter 206. The termination circuit 204 includes a resistor 207, a resistor 208, a switch 209, and a switch 210. The data output circuit 203 includes a NAND circuit 251, a NOR circuit 252, a transistor 253, and a transistor 254. In this exemplary embodiment, a case is explained in which the switch 209 and the transistor 253 are P-channel MOS transistors and the switch 210 and the transistor 254 are N-channel MOS transistors.

In the SoC circuit 100, the data signal line DQ[0] is connected to an input terminal of the buffer 202 and an output terminal of the data output circuit 203 through the external terminal 201.

The termination circuit 204 is provided between the external terminal 201 and the buffer 202. In the termination circuit 204, the switch 209 and the resistor 207 are connected in series between a high potential side power supply terminal VDD and a node N1 which is located on the signal line connecting the external terminal 201 and the buffer 202. The switch 210 and the resistor 208 are connected in series between a low potential side power supply terminal VSS and the node N1. In other words, the source terminal of the switch 209 is connected to the high potential side power supply terminal VDD. The drain terminal of the switch 209 is connected to one terminal of the resistor 207. The other terminal of the resistor 207 is connected to one terminal of the resistor 208. The other terminal of the resistor 208 is connected to the drain terminal of the switch 210. The source terminal of the switch 210 is connected to the low potential side power supply terminal VSS. The other terminal of the resistor 207 and one terminal of the resistor 208 are commonly connected to the node N1. Note that the switch 209 and the resistor 207 which are connected in series between the high potential side power supply terminal VDD and the node N1 may be switched around. Similarly, the switch 210 and the resistor 208 which are connected in series between the low potential side power supply terminal VSS and the node N1 may be switched around.

An output terminal of the buffer 202 is connected to an input terminal IN used for inputting data of the control circuit 205. An output terminal C1 of the control circuit 205 is connected to the gate terminal of the switch 209 and the gate terminal of the switch 210 through the inverter 206. Such a peripheral circuit configuration is also employed in the other bidirectional signal lines. Note that the control circuit 205 is commonly provided to these bidirectional signal lines.

An output terminal OUT used for outputting data of the control circuit 205 is connected to one input terminal of the NAND circuit 251 and one input terminal of the NOR circuit 252 in the data output circuit 203. An output terminal E1 for outputting a control signal 230 of the control circuit 205 is connected to the other input terminal of the NAND circuit 251 and the other input terminal of the NOR circuit 252 through the inverter 255 in the data output circuit 203. An output terminal of the NAND circuit 251 is connected to the gate terminal of the transistor 253. An output terminal of the NOR circuit 252 is connected to the gate terminal of the transistor 254. The transistors 253 and 254 are connected in series between the high potential side power supply terminal VDD and the low potential side power supply terminal VSS. In other words, the transistors 253 and 254 constitute an inverter. The drain terminal of the transistor 253 and the drain terminal of the transistor 254 are commonly connected to a node which is located on the signal line connecting between the buffer 202 and the external terminal 201. Such a peripheral circuit configuration is also employed in the other bidirectional signal lines.

Next, the operation of the semiconductor integrated circuit according to the first exemplary embodiment of the present invention will be described. A case is explained hereinafter in which the SoC circuit 100 receives (reads) the data such as the data DQ transmitted from the SDRAM circuit 101. First, the SoC circuit 100 outputs the control signal CMD to the SDRAM circuit 101. After that, for example, the SDRAM circuit 101 transmits the data DQ stored in a memory area of an address specified by the control signal CMD, and the strobe signals DQS and DQSB to the SoC circuit 100. In this case, the data DQ transmitted from the SDRAM circuit 101 has a predetermined burst length.

The SoC circuit 100 receives each signal output from the SDRAM circuit 101 through the corresponding signal line, external terminal 201, and buffer 202. Note that the SoC circuit 100 receives the data DQ in synchronization with the strobe signals DQS and DQSB. The data DQ received by the SoC circuit 100 is input to the control circuit 205 and the other peripheral circuits (not shown). A period between the time when the SoC circuit 100 starts to transmit the control signal CMD and the time when the SoC circuit 100 starts to receive the corresponding data DQ is called a read latency (RL).

When receiving the data transmitted from the SDRAM circuit 101, the SoC circuit 100 controls the ODT function of the corresponding termination circuit 204 to be turned on to reduce power-supply noise occurring on the data signal line DQ and the strobe signal lines DQS and DQSB. Specifically, the SoC circuit 100 controls the switches 209 and 210, which are provided in the corresponding termination circuit 204, to be turned on based on a control signal 200 from the control circuit 205 and sets the node on the corresponding signal line to a predetermined potential (for example, one-half of the high potential side power supply voltage VDD). This makes it possible for the SoC circuit 100 to receive the data accurately by reducing the power-supply noise included in the received data.

Moreover, the SoC circuit 100 controls the data output circuit 203 not to output the data to the SDRAM circuit 101 based on the control signal 230 from the control circuit 205. In other words, the SoC circuit 100 controls the output of the data output circuit 203 to be set to a high impedance state (HiZ) based on the control signal 230 of L level. The output of the data output circuit 203 indicates HiZ because the transistors 253 and 254 are both controlled to be turned off when the control signal 230 is L level. This makes it possible for the SoC circuit 100 to accurately receive the data transmitted from the SDRAM circuit 101 without being influenced by the other data output from the data output circuit 203.

A case is explained hereinafter in which the SoC circuit 100 transmits (writes) the data to the SDRAM circuit 101. First, the SoC circuit 100 outputs the control signal CMD to the SDRAM circuit 101. After that, the SoC circuit 100 transmits the data DQ and the strobe signals DQS and DQSB to the SDRAM circuit 101. In this case, the data DQ transmitted from the SoC circuit 100 has a predetermined burst length.

Then, the SDRAM circuit 101 receives the data DQ in synchronization with the strobe signals DQS and DQSB. For example, the data DQ is written into the memory area of the address specified by the control signal CMD. A period between the time when the SoC circuit 100 starts to transmit the control signal CMD and the time when the SoC circuit 100 starts to transmit the corresponding data DQ is called a write latency (WL).

When transmitting the data to the SDRAM circuit 101, the SoC circuit 100 controls the CDT function of the corresponding termination circuit 204 to be turned off. Specifically, the SoC circuit 100 controls the switches 209 and 210, which are provided in the corresponding termination circuit 204, to be turned off based on the control signal 200 from the control circuit 205, thereby preventing the potential of the data transmitted to the SDRAM circuit 101 through the data output circuit 203 and the external terminal 201 from being decayed. This makes it possible for the SoC circuit 100 to transmit the data accurately.

The SoC circuit 100 controls the data output circuit 203 to output the data to the SDRAM circuit 101 based on the control signal 230 from the control circuit 205. In other words, the SoC circuit 100 controls the data output circuit 203 to output the data to the SDRAM circuit 101 based on the control signal 230 of H level. When the control signal 230 is H level, the transistors 253 and 254 are controlled to be turned on and off in accordance with the data output from the control circuit 205. Thereby, the SoC circuit 100 transmits the data to the SDRAM circuit 101.

In this manner, the SoC circuit 100 switches between a read mode in which the SoC circuit 100 receives the data transmitted from the SDRAM circuit 101 and a write mode in which the SoC circuit 100 transmits the data to the SDRAM circuit 101, based on the control signal CMD. Note that the SoC circuit 100 outputs the control signal CMD which has a data length corresponding to one cycle of the clock signal CK at predetermined time intervals.

For example, the SoC circuit 100 receives data such as the data DQ in the read mode or transmits the data in the write mode, and after the predetermined time interval, receives or transmits another data in the same mode. Alternatively, the SoC circuit 100 receives data such as the data DQ in the read mode or transmits the data in the write mode, and after the predetermined time interval, receives or transmits another data in a different mode. The data transmission and reception as described above is repeated.

The SoC circuit 100 according to this exemplary embodiment exhibits characteristics when the SoC circuit 100 transmits data such as the data DQ in the write mode, and after the predetermined time interval, transmits another data in the write mode again. The operation of the SoC circuit 100 in this case will be described with reference to FIG. 3.

First, the SoC circuit 100 outputs the control signal CMD (which is indicated by "A" shown in FIG. 3 and is hereinafter referred to as "write command A") to the SDRAM circuit 101. Then, the SoC circuit 100 transmits the data DQ ("D" shown in FIG. 3), which has a predetermined burst length, and the corresponding strobe signals DQS and DQSB to the SDRAM circuit 101 after the period of the write latency WL ("C" shown in FIG. 3).

In this case, when transmitting the data, the SoC circuit 100 controls the corresponding data output circuit 203 to output the data.

After outputting the write command A, the SoC circuit 100 outputs a write command E ("E" shown in FIG. 3) after the period of the predetermined time interval ("B" shown in FIG. 3). Then, the SoC circuit 100 transmits the data DQ ("G" shown in FIG. 3), which has a predetermined burst length, and the corresponding strobe signals DQS and DQSB to the SDRAM circuit 101 after the period of the write latency WL ("F" shown in FIG. 3).

In this case, the control circuit 205 calculates a period (H), in which the data DQ is not transmitted, based on the interval (B) of the write commands (A, E), the write latency WL (C, F), and the burst length (D, G) of the data DQ. Based on the period thus obtained, the control circuit 205 determines whether the data output circuit 203 outputs the data or not during the period (H) in which the data DQ is not transmitted. Then, the control circuit 205 outputs the control signal 230 to the data output circuit 203 based on the results of the determination.

When the period (H) is less than or equal to a predetermined threshold, the data output circuit 203 keeps outputting the last data (data "03" shown in FIG. 3) of the data DQ (D) during the period (H). When the period (H) exceeds the predetermined threshold, the data output circuit 203 switches the output to HiZ during the period (H).

In the case where the write mode is repeated, when the data output circuit 203 keeps outputting the last data during the period (for example, "H" shown in FIG. 3) in which the data transmission is not executed, power-supply noise, which may occur due to switching of the output to HiZ by the data output circuit 203, does not occur on the signal line at the output side of to the data output circuit 203. Therefore, it is possible for the SoC circuit 100 to transmit the data accurately by reducing the power-supply noise which has been a problem in the related art.

In the case where the write mode is repeated, when the period (for example, "H" shown in FIG. 3) in which the data transmission is not executed exceeds the threshold, the data output circuit 203 switches the output to HiZ during the period in which the data transmission is not executed. In this case, the power-supply noise on the corresponding signal line caused by switching the output state of the data output circuit 203 converges because the period in which the data transmission is not executed is sufficiently long. In other words, the SoC circuit 100 can transmit another data output from the data output circuit 203 without being influenced by the power-supply noise. This makes it possible for the SoC circuit 100 to transmit the data accurately by reducing the effect of the power-supply noise. Note that the timing of switching the output of the data output circuit 203 to HiZ may be arbitrarily determined as long as the power-supply noise is converged by the time when the next data transmission starts.

As described above, in the case where the data transmitting circuit (for example, the SoC circuit 100) continuously transmits the data, the semiconductor integrated circuit according to this exemplary embodiment controls the output of the data output circuit (for example, the data output circuit 203) included in the data transmitting circuit based on a data transmission interval. In other words, the semiconductor integrated circuit according to this exemplary embodiment controls the data output circuit continuously to output the data or to switch the output to HiZ. This makes it possible for the semiconductor integrated circuit according to this exemplary embodiment to transmit the data accurately by reducing the effect of the power-supply noise.

Note that the present invention is not limited to the above exemplary embodiments, but can be modified as appropriate within the scope of the present invention. For example, though the above-mentioned exemplary embodiments have described an example in which the SoC circuit 100 transmits the data to the SDRAM circuit 101, the present invention is not limited thereto. The present invention is also applicable to a circuit configuration in which the SDRAM circuit 101 transmits the data to the SoC circuit 100. In this case, the data output circuit included in the SDRAM circuit 101 must be controlled as in the case of the data output circuit 203 included in the SoC circuit 100.

Though the above-mentioned exemplary embodiments have described an example in which, when the data transmitting circuit (for example, the SoC circuit 100) continuously transmits data, the control circuit 205 outputs the control signal (for example, the control signal 230) based on the interval of the address command such as a write command, the write latency WL, and the burst length of the data DQ, the present invention is not limited thereto. The present invention is also applicable to a circuit configuration for outputting the control signal (for example, the control signal 230) based on at least one of the above-mentioned pieces of information (for example, the interval of the address command) if it is possible to control the output of the data output circuit 203 based on the data transmission interval.

Though the above-mentioned exemplary embodiments have described the case where the signal line which is used for the output of the data output circuit 203 is a bidirectional signal line, the present invention is not limited thereto. The present invention is also applicable to a circuit configuration in which the signal line which is used for the output of the data output circuit 203 is a signal line dedicated for transmitting data.

The termination circuit is not limited to the circuits illustrated in the above-mentioned exemplary embodiments. The present invention is also applicable to a circuit configuration including a resistor and a switch which are connected in series between the power supply terminal having the predetermined potential (for example, one-half of the high potential side power supply voltage VDD) and the node on the corresponding signal line. Moreover, though the above-mentioned exemplary embodiments have described the case where the termination circuit is included, the present invention is not limited thereto. The present invention is also applicable to a circuit configuration in which the termination circuit is not included.

Though the above-mentioned exemplary embodiments have described an example in which the semiconductor integrated circuit includes a single SDRAM circuit, the present invention is not limited thereto. The semiconductor integrated circuit according to the present invention is also applicable to a circuit configuration including a plurality of SDRAM circuits.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:

1. A semiconductor integrated circuit comprising:
   a data transmitting circuit; and
   a data receiving circuit that receives data transmitted from the data transmitting circuit, wherein
   the data transmitting circuit comprises:
      a data output circuit that outputs the data or sets an output to a high impedance state; and
      a control circuit that outputs a control signal to the data output circuit so that the data output circuit outputs the data when the data transmitting circuit transmits the data, and the data output circuit keeps outputting data last output in the previous data transmission, during a predetermined period after the previous data transmission when the data transmitting circuit further transmits another data after transmitting the data,
   wherein the predetermined period is decided based on a data transmission interval of the data transmitting circuit,
   wherein the data transmission interval is decided based on a period between a time when the data transmitting circuit outputs a command for transmitting data to the data receiving circuit and a time when the data transmitting circuit further outputs a command for transmitting another data to the data receiving circuit.

2. The semiconductor integrated circuit according to claim 1, wherein the data transmission interval is decided based on a latency between a time when the data transmitting circuit outputs a command for transmitting data to the data receiving circuit and a time when the data transmitting circuit starts to transmit the data.

3. The semiconductor integrated circuit according to claim 1, wherein the data transmission interval is decided based on a burst length of the data.

4. The semiconductor integrated circuit according to claim 1, wherein the control circuit outputs the control signal so that the output of the data output circuit is set to the high impedance state instead of keeping outputting data last output in the previous data transmission when the data transmission circuit further transmits another data after transmitting the data and when the data transmission interval exceeds a predetermined threshold.

5. The semiconductor integrated circuit according to claim 1, wherein
   the data output circuit comprises an inverter that includes a P-channel MOS transistor and all N-channel MOS transistor, and
   the P-channel MOS transistor and the N-channel MOS transistor are turned off when the output of the data output circuit is set to the high impedance state, and one of the P-channel MOS transistor and the N-channel MOS transistor is turned on and the other is turned off based on the data when the data output circuit outputs the data.

* * * * *